(12) United States Patent
Naji

(10) Patent No.: US 6,278,631 B1
(45) Date of Patent: Aug. 21, 2001

(54) MAGNETIC RANDOM ACCESS MEMORY ARRAY DIVIDED INTO A PLURALITY OF MEMORY BANKS

(75) Inventor: Peter K. Naji, Phoenix, AZ (US)

(73) Assignee: Motorola, Inc., Scahumburg, IL (US)

(*) Notice: Subject to any disclaimer, the term of this patent is extended or adjusted under 35 U.S.C. 154(b) by 0 days.

(21) Appl. No.: 09/568,822

(22) Filed: May 10, 2000

Related U.S. Application Data

(62) Division of application No. 09/128,020, filed on Aug. 3, 1998, now Pat. No. 6,111,781.

(51) Int. Cl.[7] .................................................. G11C 11/00
(52) U.S. Cl. ............................................ 365/158; 365/173
(58) Field of Search .................................... 365/158, 171, 365/173, 210, 66, 55

(56) References Cited

U.S. PATENT DOCUMENTS

| | | | |
|---|---|---|---|
| 5,173,873 | 12/1992 | Wu et al. | 365/173 |
| 5,831,920 | 11/1998 | Chen et al. | 365/225.5 |
| 5,894,447 | 4/1999 | Takashima | 365/158 |
| 5,946,227 | 8/1999 | Naji | 365/158 |
| 6,055,178 * | 4/2000 | Naji | 365/158 |

FOREIGN PATENT DOCUMENTS 0613148    8/1994   (EP) ................................ G11C/11/15

* cited by examiner

Primary Examiner—A. Zarabian
(74) Attorney, Agent, or Firm—William E. Koch

(57) ABSTRACT

An MRAM device has a new type of memory bank (10) that includes bit lines (21–24), a reference line (27) and digit lines (25, 26), on intersections of bit lines and digit lines a plurality of magnetic memory cells (15–18) are arrayed. Bit lines are formed on both sides of the reference line on a substrate. Since each bit line is fabricated closely to the reference line, each cell has substantially the same hysteresis characteristics, which allow the MRAM device to provide a steady operation mode.

3 Claims, 3 Drawing Sheets

# MAGNETIC RANDOM ACCESS MEMORY ARRAY DIVIDED INTO A PLURALITY OF MEMORY BANKS

This application is a Div. of Ser. No. 09/128,020 filed Aug. 3, 1998, U.S. Pat. No. 6,111,781 issued Aug. 29, 2000.

FIELD OF THE INVENTION

The present invention relates to a magnetic random access memory, and more particularly, to a magnetic random access memory with a plurality of memory banks, each memory bank having bit lines allocated on both sides of a reference line.

BACKGROUND OF THE INVENTION

A magnetoresistive random access memory (MRAM), which is one of non-volatile memory devices, includes a plurality of magnetic memory cells. It is known that the magnetoresistive effect appears in multi-layer films that are alternately stacked by magnetic layers and non-magnetic layers. Magnetic resistance over a magnetic memory cell indicates minimum and maximum values when magnetization vectors in magnetic layers point in the same or opposite directions, respectively. The same and opposite directions of magnetization vectors in two magnetic layers are called "Parallel" and "Anti-parallel" states, respectively. When magnetic material is employed for a memory device, Parallel and Anti-parallel directions, for example, are logically defined as "0" and "1" states, respectively. The magnetization vectors in magnetic layers are very quickly switched to another direction by an application of a magnetic field over a switching point, and maintain the magnetization direction even without a magnetic field.

The MRAM device normally has magnetic memory cells arranged on intersections of metal lines, which are placed in rows and columns. The MRAM circuit, for instance, is described in a co-pending U.S. patent application entitled "MAGNETORESISTIVE RANDOM ACCESS MEMORY WITH SHARED WORD AND DIGIT LINES," Motorola docket No. CR98–038, filed July, 1998 assigned to the same assignee, and incorporated herein by reference.

The MRAM device generally is formed on a substrate such as a semiconductor or glass. Magnetic and non-magnetic layers are sequentially deposited on the substrate and etched down to form magnetic memory cells, which are 0.2 $\mu$m by 0.3 $\mu$m in size, for instance. The magnetic layer usually has a 10–100Å thickness while the non-magnetic layer is 10–30Å thick. The thickness of the magnetic and non-magnetic layers are deposited on the substrate as invariably and evenly as possible, which allows each magnetic memory cell on the substrate to provide steady and constant hysteresis characteristics. It, in reality, is very hard to control and keep a thickness of each layer constant to every magnetic memory cell on the entire substrate.

The MRAM device includes magnetic memory cells for storing specific information, and reference magnetic memory cells where a reference state is maintained. In order to read states stored in a magnetic memory cell (active or target cell), a sense current and a reference current are applied to the target cell and a reference magnetic memory cell (reference cell), respectively. The target and reference cells generate voltage drops across the cells that correspond to magnetic resistance values of the target and reference cells, respectively. These voltages are compared to each other to determine states in the target cell. Therefore, it is desirable that each magnetic cell has as same or similar hysteresis characteristics as possible, in order to execute a steady reading process and to get states correctly.

Accordingly, it is a purpose of the present invention to provide an improved MRAM device that has a high-speed, high-density, and low power memory.

It is another purpose of the present invention to provide an improved MRAM device that has a high reliability reading process.

It is still another purpose of the present invention to provide an improved MRAM device that has a high tolerance for temperature variation.

SUMMARY OF THE INVENTION

These needs and others are substantially met through provision of a magnetoresistive random access memory (MRAM) device that includes memory banks, each memory bank having a reference line, bit lines and digit lines. Bit lines are allocated parallel to the reference line and on both sides of the reference line. Word lines and digit lines, which are perpendicular to bit lines, form intersections on which magnetic memory cells are arrayed for storing information. Reference magnetic memory cells are arranged on intersections of the reference line and digit lines. A memory cell has magnetic layers separated by a non-magnetic layer. Magnetic and non-magnetic layers, for example, are deposited on a substrate with thicknesses of 10–100Å and 10–30Å, respectively. The difficulty for uniformly forming the thickness and the size of the memory element over the entire substrate allows memory cells to indicate different hysteresis characteristics that result in a reading error. In order to prevent mistakenly reading states in a magnetic memory cell, the present invention divides a memory array into a plurality of memory banks. Each memory bank includes a reference line, and bit lines that are formed on both sides of the reference line. Since bit lines are formed adjacent to the reference line on the substrate, magnetic memory cells have the same or similar hysteresis characteristics as reference memory cells.

DETAILED DESCRIPTION OF THE PREFERRED EMBODIMENTS

Figure 1:
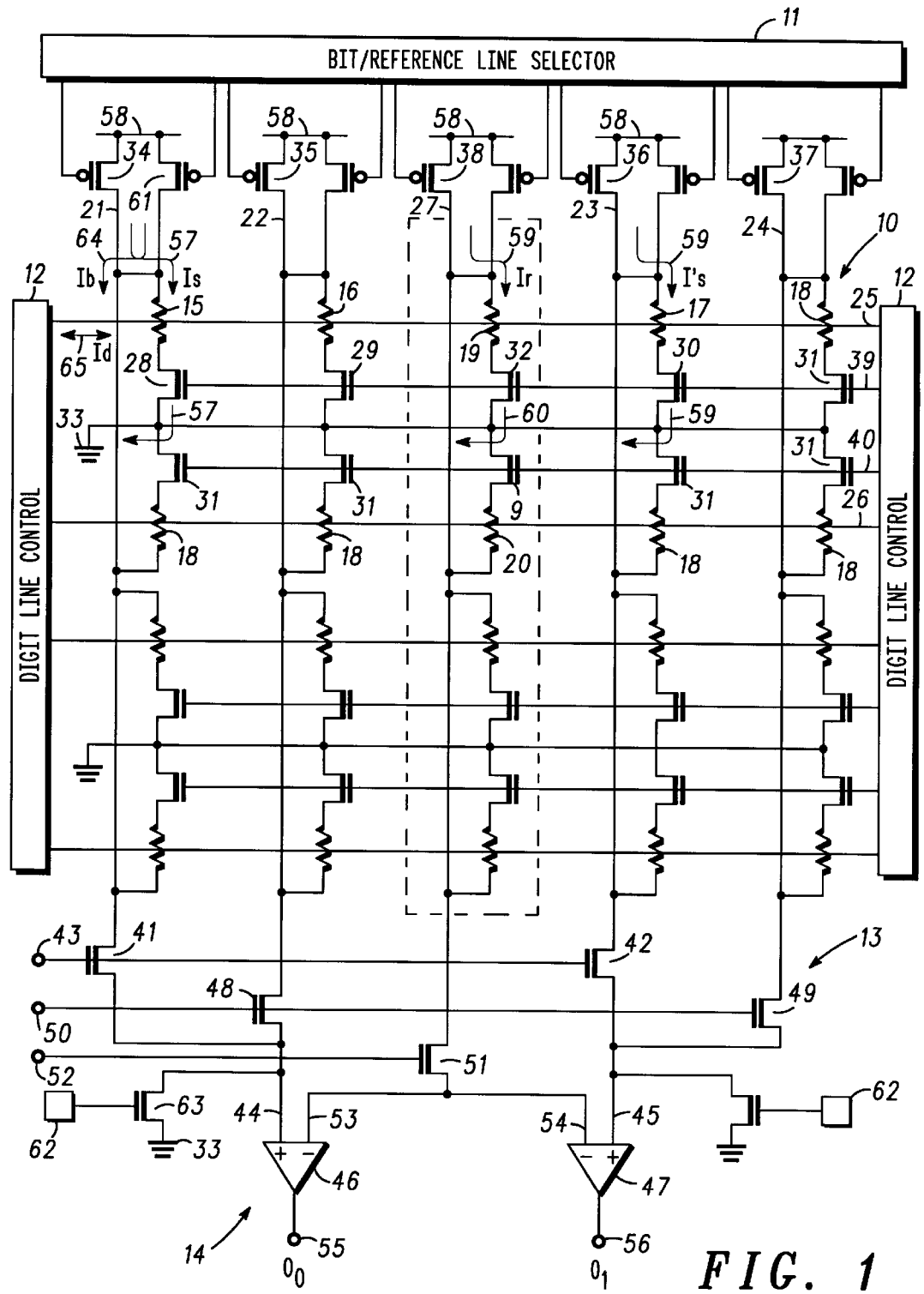
FIG. 1 shows a memory bank circuit and other peripheral circuits in an MRAM device.

FIG. 1 shows a memory bank circuit 10 and other peripheral circuits including a bit/reference line selector 11, a digit line control 12, a selector 13, and a comparator circuit 14. These circuits are fabricated on a semiconductor or a glass substrate. Although one memory bank is illustrated in FIG. 1, it should be understood that an MRAM device includes a plurality of memory banks for more memory capacity, which will be described hereinafter with reference to FIG. 5.

Figure 3:
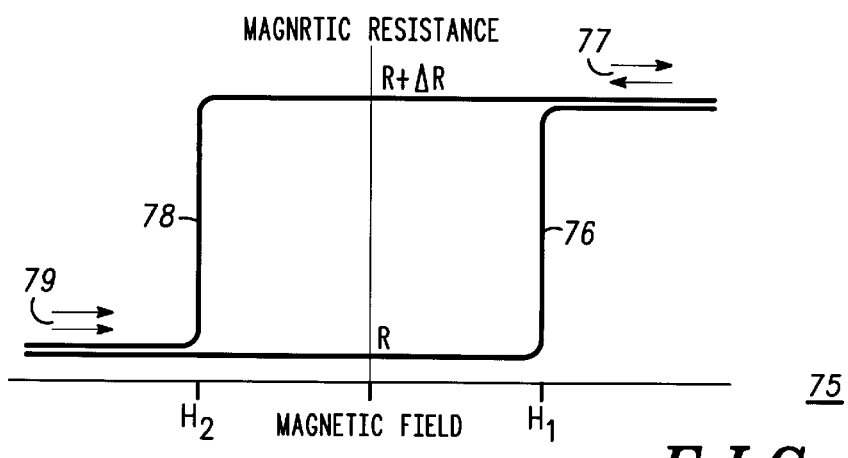
FIG. 3 shows a graph illustrating hysteresis characteristics of the magnetic memory cell described in FIG. 2.

Memory bank 10 has magnetic memory cells (memory cells) 15–18 and reference memory cells 19 and 20. Memory cells 15–18 are placed on intersections of sense or bit lines 21–24 and torque or digit lines 25 and 26 perpendicular to bit lines 21–24, while reference memory cells (reference cells) 19 and 20 are placed on intersections of a reference line 27 and digit lines 25 and 26. Memory cells 15–18 and reference cells 19 and 20 form the same cell structure as illustrated in FIG. 3, the details of which will be discussed hereinafter. Memory cells 15–18 and reference cell 19 are coupled in series to transistors 28–32, which control a current flow in memory cells 15–18 and reference cell 19 to a ground or common line 33. As can be seen in FIG. 1, memory bank 10 has a single reference line and four bit lines. Every two lines of four bit lines are symmetrically allocated on both sides of the reference line, thereby each memory cell on bit and reference lines is closely placed on the substrate. Although memory bank 10 includes two bit lines on both sides of the reference line, furthermore it is possible to add other bit lines for enlargement of the memory capacity.

Bit lines 21–24 and reference line 27 are coupled to switching transistors 34–38 that selector 11 manages so as to provide a sense current and a reference current, respectively. Digit line control 12 places digit lines 25 and 26 adjacent the memory cells, and couples lines 39–40 to transistors 28–32. Transistors 41 and 42, in response to a signal on terminal 43, couple bit lines 21 and 23 to non-inverting inputs 44 and 45 of comparators 46 and 47, while transistors 48 and 49, in response to a signal on terminal 50, couple bit lines 22 and 24 to non-inverting inputs 44 and 45 of comparators 46 and 47 as well. Transistor 51 controlled by a signal on a terminal 52 couples reference line 27 to inverting inputs 53 and 54 of comparators 46 and 47 Comparators 46 and 47 compare voltages on non-inverting inputs 44 and 45 to reference voltage on inverting inputs 53 and 54 to produce output signals $O_0$ and $O_1$ on output terminals 55 and 56.

In an operation for reading states in target cells 15 and 17, for example, selector 11 sends turn-on signals to gate electrodes of transistors 34 and 36 and transistor 38 to activate bit lines 21 and 23 and reference line 27, respectively. Next, line control 12 provides a turn-on signal on line 39 to allow transistors 28–32 to turn on. Consequently, a sense current Is, indicated by an arrow 57, flows from a power line 58 through transistor 34, target cell 15 and transistor 28 to common line 33 while a sense current Is', indicated by an arrow 59, flows from power line 58 through transistor 36, target cell 17 and transistor 30 to common line 33. As well as sense currents Is and Is', a reference current Ir expressed by an arrow 60 is supplied from power line 58 through transistor 38, reference cell 19 and transistor 32 to common line 33. Sense currents Is and Is' generate voltage drops across target cells 15 and 17 that are introduced to non-inverting inputs 44 and 45 of comparators 46 and 47 after turning transistors 41 and 42 on. Furthermore, reference current Ir produces a voltage drop across reference cell 19 that is conducted through transistor 51 to both inverting inputs 53 and 54 of comparators 46 and 47. Comparators 46 and 47 compare voltage values on non-inverting and inverting inputs. Comparator 46, for instance, provides a high-voltage signal on output terminal 55 when the voltage drop across target cell 15 is higher than the reference cell 19; otherwise a low-voltage appears on output terminal 55.

A gate voltage applied to transistor 38 from line selector 11 controls reference current Ir. Assuming a magnetic memory cell produces a maximum voltage Vmax at an Anti-parallel state and a minimum voltage Vmin at a Parallel state, reference current Ir adjusts a reference voltage Vref generated across a reference magnetic cell so as to have a half voltage between Vmax and Vmin; that is, $$Vref=(Vmax+Vmin)/2$$

In order to write states in target cell 15, for instance, line selector 11 turns on transistor 61 and a turn-on signal is provided on terminal 43 to turn transistor 41 on, which allows bit line 21 to activate. At the same time a bit line program control 62 turns on transistor 63. Then bit current Ib indicated by an arrow 64 flows from power line 58 through transistor 61, bit line 21, transistor 41, and transistor 63, to common line 33. Furthermore, line control 12 activates digit line 25 to provide digit current Id indicated by an arrow 65. Bit current Ib and digit current Id generate magnetic fields, respectively. These magnetic fields are combined toward target cell 15. The combination of the magnetic fields from Ib and Id is sufficient to switch the magnetization vectors in target cell 15, however regarding other cells 16–18, the individual magnetic fields are less than the magnetic field required to change the magnetization direction in a memory cell. At least one of the bit current or the digit current has to be reversible to store the two different states in the selected target cell. In this embodiment, digit line control 12 manages the directions of digit current Id. During a program mode, digit line control 12 pulls down lines 39 and 40, turning off transistors 28–32. Also comparators 46 and 47 are disabled, and no current flows through reference line 23 during a program mode.

Figure 2:
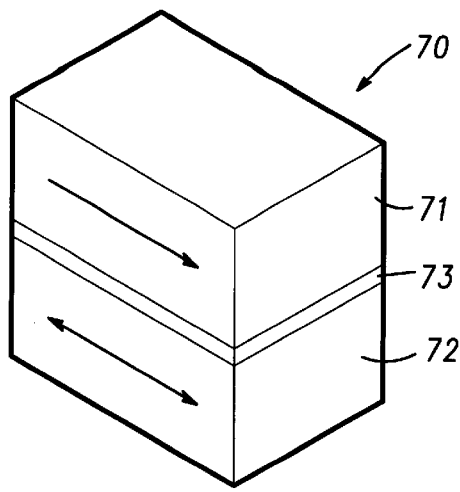
FIG. 2 shows a simplified and enlarged magnetic memory cell with magnetic layers separated by a non-magnetic layer.

FIGS. 2 and 3 show an isometric view of a simplified and enlarged memory cell structure 70 and hysteresis characteristics 75 of memory cell 70 in FIG. 2. It should be noted that other types of magnetic memory cells can be employed for the memory device. Memory cell 70 has three layers that include first and second magnetic layers 71 and 72 separated by a non-magnetic layer 73. First and second magnetic layers 71 and 72 use magnetic material such as CoFe and NiFeCo, respectively. Magnetization vectors in first magnetic layer 71, for example, are magnetically pinned by an antiferromagnetic layer (not shown) that is placed adjacent layer 71. Second magnetic layer 72, which is magnetically free, alternates magnetization vectors responding to an external magnetic field. Non-magnetic layer 73, for example, is formed by an insulating material such as $Al_2O_3$ and has a thickness of around 30Å. The thin thickness allows non-magnetic layer 73 to form a tunneling junction between first and second magnetic layers 71 and 72, through which a tunneling current flows. As will be seen in FIG. 3, a magnetic resistance of the memory cell changes according to directions of magnetization in second magnetic layer 72 that causes a tunneling current in non-magnetic layer 73 to vary. The magnetic layers would be patterned to substantially align the magnetization as shown in U.S. Pat. No. 5,757,695.

Referring to FIG. 3 again, the abscissa of FIG. 3 indicates a direction and strength of a magnetic field applied to memory cell 70. The ordinate represents the magnetic resistance of the memory cell 70. Assuming memory cell 70 is in the state that magnetization vectors in layers 71 and 72 point in the Parallel state (same direction) under no external magnetic field, the external magnetic field changes to a value H1 moving to the right along the abscissa. As shown by curve 76, magnetization vectors in second magnetic (free) layer 72 are switched to the left at a magnetic field H1 and magnetization vectors in layers 71 and 72 are oriented in the Anti-parallel state (opposite direction) as indicated by arrows 77. Consequently, a magnetic resistance of memory cell 70 increases from R by ΔR. Next changing the magnetic field from H1 as shown by curve 78, magnetization vectors in second magnetic layer 72 are switched at a magnetic field H2 to the right. Consequently the magnetic resistance is lowered to R by ΔR and magnetization vectors in layers 71 and 72 point in the Parallel direction as indicated by arrows 79. An example of the memory cell structure is shown in U.S. Pat. No. 5,768,181.

Figure 4:
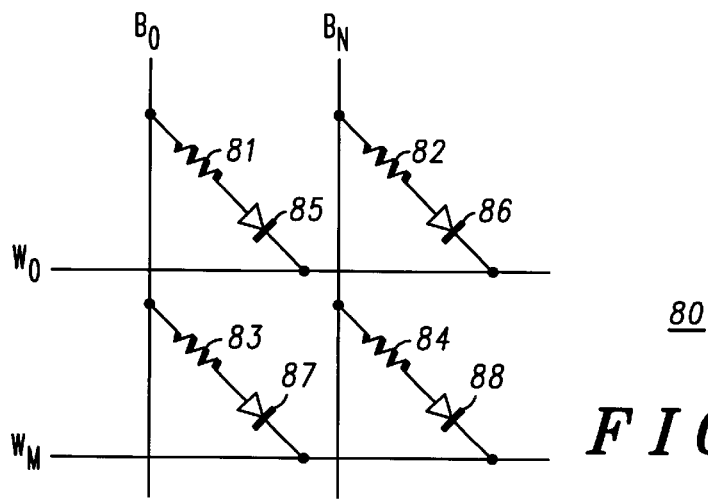
FIG. 4 shows another embodiment for an MRAM element circuit.

Turning now to FIG. 4, another embodiment of an array 80 of cells similar to cell 70 in FIG. 2 is illustrated with the cells being oriented in rows and columns. Only four cells 81 through 84 are illustrated for convenience, but it will be understood that any desired number of cells which can be practically fabricated can be employed. A plurality of diodes 85 through 88 are supplied, one each being associated with each cell 81 through 84. In this embodiment, one terminal of the associated diode is connected to the lower or upper magnetic layer of the associated cell by means of an electrically conductive portion, which may include material such as a conductive layer, or solder, or the diodes may be integrated into a substrate or upper layer and formed with the conductive portion as a portion of the diode. A second terminal of the diode is connected to a sense line and the other of the first and second magnetic layers of the cell are connected to a word line as shown in U.S. Pat. No. 5,734,605.

In FIG. 4, cell 81 has a magnetic layer connected to one terminal of diode 85 and the other magnetic layer connected to a bit line $B_0$. The second terminal of diode 85 is connected to a word line $W_0$. Thus, cell 81 is uniquely addressed by selecting bit line $B_0$ and word line $W_0$. Any change in resistance of cell 81 can be easily and quickly sensed by connecting sensing apparatus between bit line $B_0$ and word line $W_0$. To select cell 81, diode 85 is forward biased. Once diode 85 is forward biased, current flows from bit line $B_0$ through cell 81 and diode 85 to word line $W_0$. All other diodes 86–88 are reverse biased. As a result, no current flows through cell 82–84.

Figure 5:
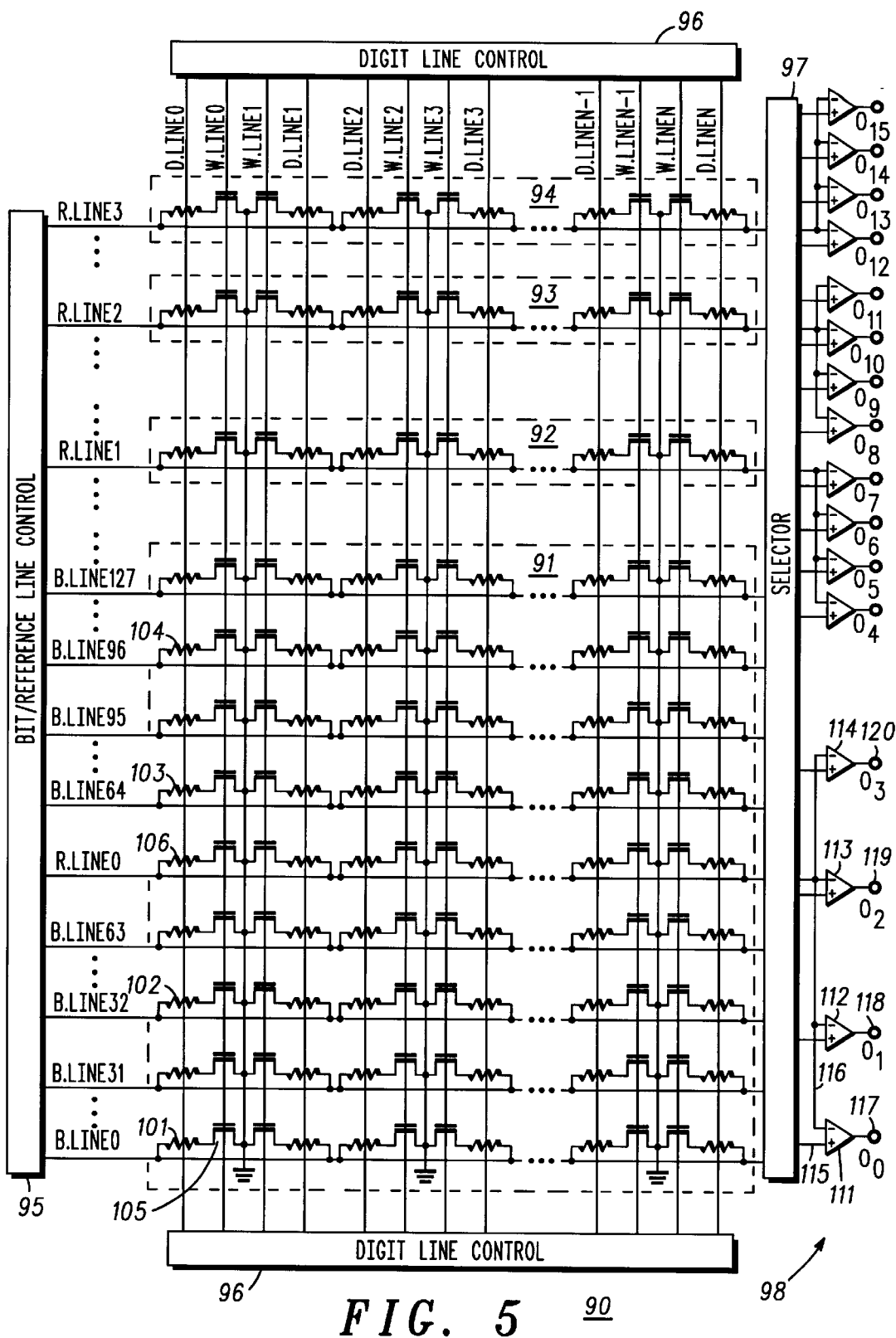
FIG. 5 shows an entire MRAM device circuit having four memory banks.

FIG. 5 shows an entire MRAM circuit 90 that includes memory banks 91–94, a bit/reference line control 95, digit line control 96, selector 97, and a comparator circuit 98. These circuits are fabricated on a semiconductor or a glass substrate. MRAM circuit 90 has four memory banks 91–94. It should be noted that more memory banks are established upon request of more memory capacity. Only memory bank 91 will be discussed hereinafter because memory banks 92–94 have the same circuit structure and operation as memory bank 91.

Memory bank 91 includes one reference line R.LINE0, and one hundred twenty eight bit lines B.LINE0–B.LINE127 that are divided into four groups, that is, first group for bit lines B.LINE0–B.LINE31, second group for bit lines B.LINE32–B.LINE63, third group for bit lines B.LINE64–B.LINE95, and fourth group for bit lines B.LINE96–B.LINE127. First and second groups and third and fourth groups are symmetrically and physically allocated on both sides of reference line R.LINE0 on a substrate. Magnetic memory cells are arrayed on intersections of bit lines B.LINE0–B.LINE127 and digit lines D.LINE0–D.LINE N while reference magnetic memory cells are placed on intersections of reference line R.LINE0 and digit lines D.LINE0–D.LINE N. Each memory cell, for instance, a cell 101 is coupled to a transistor 105 that, in response to a signal on a word line W.LINE0, switches on and off a sense current supplied from bit line B.LINE0 to cell 101. As mentioned earlier in conjunction with FIG. 4, transistor 105 is replaceable with a diode.

In a reading operation mode, one bit line in each group is selected and activated to read magnetic states in a target cell. For example, when line control 95 selects bit lines B.LINE0 in the first group, B.LINE32 in the second group, B.LINE64 in the third group, and B.LINE96 in the fourth group, and at the same time line control 96 sends a turn-on signal on word line W.LINE0. Then, target cells 101–104 are activated to provide sense currents therein, respectively. At the same time of activation for the bit lines, line control 95 supplies a reference current into reference line R.LINE0 to generate a reference voltage across a reference memory cell 106. Voltage drops across target cells 101–104 and the reference voltage are applied to comparators 111–114 through selector 97. A voltage drop across target cell 101, for example, is introduced to selector 97 by way of bit line B.LINE0, while the reference voltage is provided to selector 97 through reference line R.LINE0. Selector 97 connects bit line B.LINE0 and reference line R.LINE0 to non-inverting input 115 and inverting input 116 of comparator 111, respectively. Comparator 111 finally evaluates voltages at both inputs to set an output signal $O_0$ at an output terminal 117.

The same process for second, third, and fourth groups works as well as the above for the first group, that allows comparators 118–119 to provide output signals $O_1$–$O_3$ at output terminal 118–120, respectively. Furthermore, memory banks 92–94 operate in the same function as memory bank 91, as a result output signals $O_4$–$O_{15}$ are furnished. Accordingly, memory device 90, which has four memory banks, each bank including four groups, simultaneously provides sixteen outputs.

Thus, a new and improved MRAM device has been fully disclosed which allocates memory banks on a substrate, each memory bank including bit lines and a reference line on which magnetic memory cells and reference memory cells are arrayed. These cells have very thin layers. In generally, it is very hard to uniformly control the width of layers over the entire substrate in order for all the cells to have the same hysteresis characteristic curves. In this MRAM device, bit lines are placed on both sides of the reference line in each memory bank. This feature provides a steady reading function because a target cell that is close to a reference cell is selected and activated, and both cells have substantially the same hysteresis characteristics.

What is claimed is:

1. A magnetic random access memory device comprising:

a plurality of memory arrays, each memory array including:
   a plurality of memory banks, each memory bank having a plurality of magnetic memory cells placed on intersections of first lines and second lines perpendicular to the first lines, first and second lines being electrically conductive and each magnetic memory cell being electrically coupled to a first line on each intersection, and
   a plurality of reference magnetic memory cells placed on intersections of a reference line in parallel with the second lines, the reference line being electrically conductive and each reference magnetic memory cell being electrically coupled to the reference line on each intersection;

a first controller coupled to the plurality of first lines and the reference line for activating one of the plurality of first lines and the reference line in each memory bank;

a second controller coupled to the plurality of second lines for activating one of the plurality of second lines;

a line selector for selecting the one of the plurality of first lines in each memory bank; and a plurality of comparators, each comparator having a first input, a second input and an output, the first input being coupled to the one of the plurality of first lines and the second comparator being coupled to the reference line.

2. The magnetic random access memory device as claimed in claim 1 wherein the magnetic memory cell has a first magnetic layer, a second magnetic layer, and a non-magnetic layer sandwiched by the first and second magnetic layers, the first magnetic layer electrically connected to the first line.

3. The magnetic random access memory array as claimed in claim 2 further including a plurality of switches, each switch connected to each second line for electrically coupling the second layer of each magnetic memory to a common line.

* * * * *

UNITED STATES PATENT AND TRADEMARK OFFICE
CERTIFICATE OF CORRECTION

PATENT NO.      : 6,278,631 B1
DATED           : August 21, 2001
INVENTOR(S)     : Naji It is certified that error appears in the above-identified patent and that said Letters Patent is hereby corrected as shown below:

<u>Column 1,</u>
Line 7, after the Title, please add as a new first paragraph the following paragraph:
-- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*